United States Patent [19]

McGrath et al.

[11] Patent Number: 5,760,723
[45] Date of Patent: Jun. 2, 1998

[54] DELTA-SIGMA ANALOG-TO-DIGITAL CONVERTER INCLUDING CHARGE COUPLED DEVICES

[75] Inventors: Donald Thomas McGrath, Scotia; Paul Andrew Frank, Albany; Jerome Johnson Tiemann, Schenectady, all of N.Y.

[73] Assignee: General Electric Company, Schenectady, N.Y.

[21] Appl. No.: 660,826

[22] Filed: Jun. 10, 1996

[51] Int. Cl.[6] ............................................ H03M 3/02
[52] U.S. Cl. ............................................ 341/143; 341/172
[58] Field of Search ................................ 341/143, 172

[56] References Cited

U.S. PATENT DOCUMENTS

| | | | |
|---|---|---|---|
| 5,010,340 | 4/1991 | Green | 341/172 |
| 5,065,157 | 11/1991 | Ribner et al. | |
| 5,103,229 | 4/1992 | Ribner | |
| 5,142,286 | 8/1992 | Ribner et al. | |
| 5,148,166 | 9/1992 | Ribner | |
| 5,181,032 | 1/1993 | Ribner | |
| 5,187,482 | 2/1993 | Tiemann et al. | |
| 5,248,971 | 9/1993 | Mandl | 341/141 |
| 5,283,578 | 2/1994 | Ribner et al. | |
| 5,537,115 | 7/1996 | Nagazumi | 341/172 |
| 5,585,797 | 12/1996 | Tsunai | 341/172 |

*Primary Examiner*—Marc S. Hoff
*Attorney, Agent, or Firm*—Marvin Snyder

[57] ABSTRACT

A delta sigma modulator having reduced quiescent power consumption as compared to known delta sigma modulators utilizes no operational amplifiers and includes, in one embodiment, an input CCD and a summing CCD coupled to the output of the input CCD. A readout is connected to receive output signals from the summing CCD. Both an integration/recirculation input CCD and a comparator are provided to receive output signals from the readout. The integration/recirculation input CCD feeds back a charge to the summing CCD, and the output of the comparator is connected to a fill and spill reference CCD, which also feeds back a charge to the summing CCD. The comparator output signal is an oversampled digitized version of the analog signal sampled by the input CCD. The comparator output signal is supplied to a low pass digital filter, and a decimator is connected to the output of the digital filter.

14 Claims, 2 Drawing Sheets

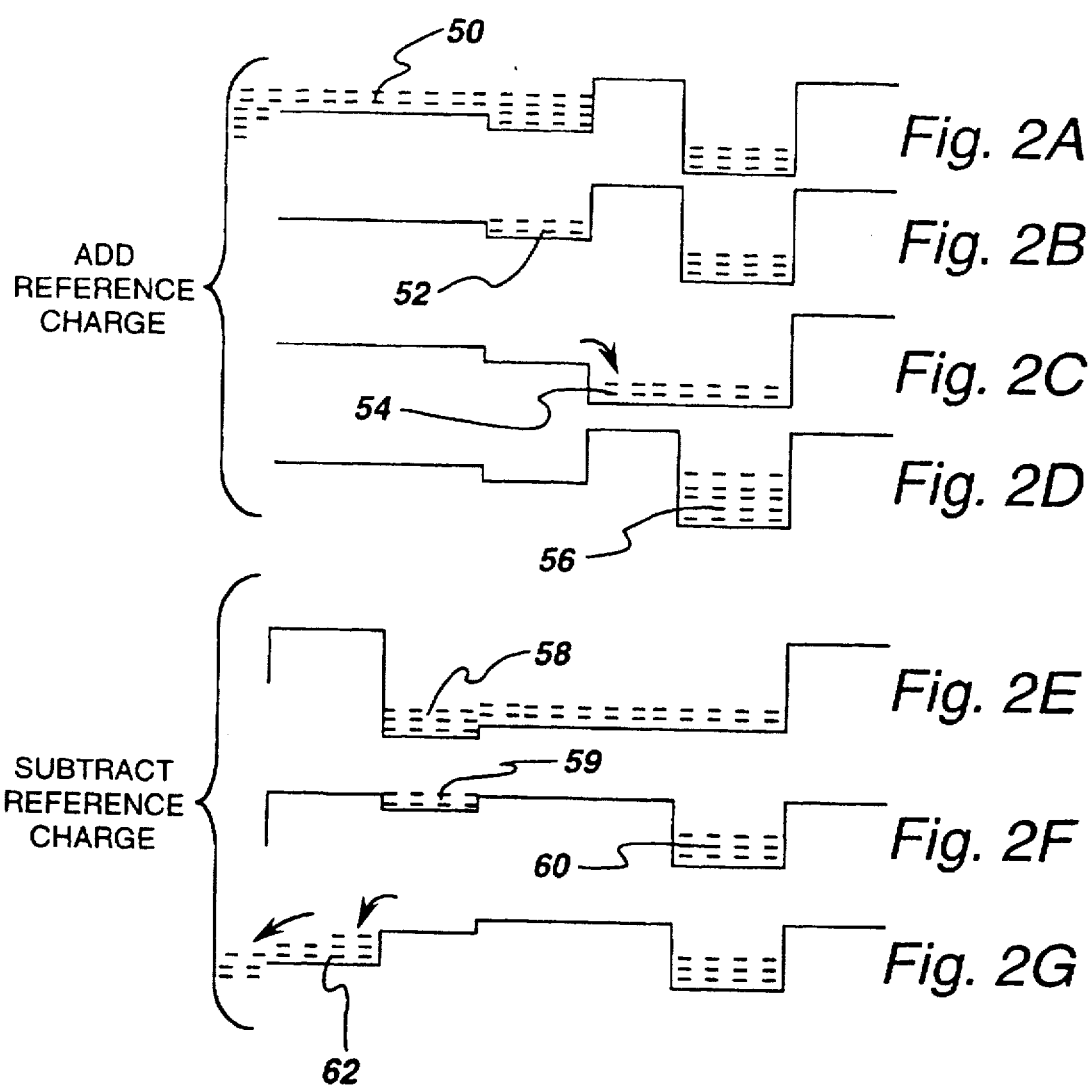

5,760,723

1

DELTA-SIGMA ANALOG-TO-DIGITAL CONVERTER INCLUDING CHARGE COUPLED DEVICES

FIELD OF THE INVENTION

This invention relates generally to delta sigma (Δ-ε) analog-to-digital (A/D) converters and, more particularly, to low power consumption delta-sigma converters.

BACKGROUND OF THE INVENTION

High resolution analog-to-digital (A/D) signal conversion can be achieved with lower resolution components through the use of over-sampled interpolative (or delta sigma) modulation followed by digital low pass filtering and decimation. Oversampling refers to operation of the modulator at a rate many times greater than the Nyquist rate. Decimation refers to reduction of the clock rate by periodic combination and deletion of samples.

Delta sigma modulators (sometimes referred to as sigma delta modulators) have been used in A/D converters for some time. In general, a delta sigma A/D converter uses an internal A/D converter of modest resolution and a complementary digital-to-analog (D/A) converter in a feedback loop. The feedback loop increases accuracy of the A/D converter in a manner consistent with the high speed operation afforded by the internal A/D converter. In known delta sigma A/D converters, resolution is predominately governed by three factors: the ratio of the modulator clock to the Nyquist rate (also referred to as the oversampling ratio), the "order" of the modulator, and the number of quantizer bits used in the delta sigma modulator. The "order" of a delta sigma modulator corresponds to the number of times the error (including quantization noise) is integrated with respect to time between the modulator input and the modulator output. A high-order modulator is desirable to increase the noise shaping of the quantization error and hence improve the resolution of the converter.

Known delta sigma modulators typically utilize operational amplifiers (op amps) for performing signal integrations. In order to satisfy bandwidth requirements, such op amps consume quiescent power. When the op amps are in a standby mode, e.g., no conversion is being performed, the op amps continue to consume quiescent power. Therefore, power is essentially wasted when the op amp is in the standby mode. Furthermore, since accuracy of an integrator implemented with op amps depends on restoration of equilibrium between the op amp input signals and the feedback signals, the speed of such an integrator is limited by the settling time of the op amps.

It would therefore be desirable to reduce the quiescent power consumption of delta sigma modulators without reducing resolution. It also would be desirable to provide an accurate integrator operable at higher speeds than heretofore achievable.

SUMMARY OF THE INVENTION

A delta sigma modulator utilizing charge coupled devices (CCDs) includes, in accordance with one embodiment of the invention, an input CCD. A summing CCD receives the input CCD output signal, and a readout CCD is coupled to the summing CCD. One input of a comparator senses output signals of the readout CCD. The integration/recirculation input CCD feeds back charge utilized by the summing CCD, and the output of the comparator is coupled to a fill and spill reference CCD, which may either feed back a charge to the

2 summing CCD or subtract charge from it. The output signal of the comparator is an oversampled digitized version of the analog signal sampled by the input CCD. The comparator output is coupled to a low pass digital filter, and a decimator is coupled to the output of the digital filter.

In operation, the input CCD samples an analog input signal and injects an amount of charge into the summing CCD. The charge injected into the summing CCD is proportional to the magnitude of the analog input signal which may include an offset to accommodate bipolar signals. The quantity of charge in the summing CCD is non-destructively read by the readout and compared to a reference level.

If the magnitude of the charge in the summing CCD is less than the reference level, a fixed amount of charge is injected into the summing CCD in the next clock period by a fill and spill reference CCD. If the magnitude of the charge in the summing CCD is greater than the reference level, an equal fixed amount of charge is subtracted from the summing CCD by the fill and spill reference CCD.

With respect to the operation of the comparator, if the magnitude of the charge supplied to the comparator is greater than a reference charge, a "high" signal, or digital "one", is produced by the comparator. If the value of the charge supplied to the comparator is less than the reference signal, a "low" signal, or digital "zero", is produced by the comparator. The digital ones and zeros produced by the comparator are filtered by the low pass digital filter and then decimated by the decimator to provide a high resolution digitized signal representative of the analog input signal.

The above described delta sigma modulator exhibits reduced quiescent power consumption as compared to known delta sigma modulators since op amps are not used by the modulator. This reduction in quiescent power consumption is achieved without a loss in resolution. Further, since addition and subtraction of charge in the above described delta sigma modulator occurs in a time period that is generally shorter than the settling time of an op amp, and as compared to the modulators utilizing op amps for integrators, higher speed is also achieved.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

FIG. 2 is an illustration of electrodes arranged on a charge coupled device used in the delta sigma modulator illustrated in FIG. 1, while FIGS. 2A–2G are potential well diagrams illustrating fill and spill operation in the regions of the electrodes on the charge coupled device used in the delta sigma modulator illustrated in FIG. 1.

DETAILED DESCRIPTION OF THE DRAWINGS

Figure 1:
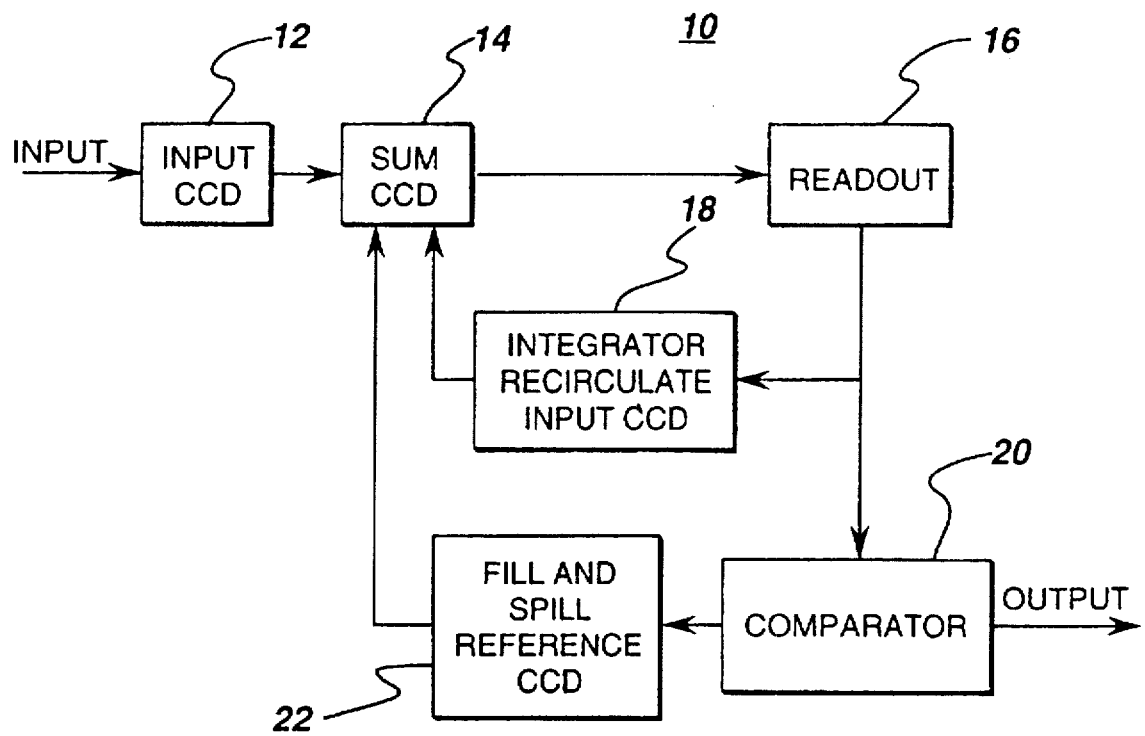
FIG. 1 is a block diagram of a delta sigma modulator implemented using charge coupled devices in accordance to one embodiment of the present invention.

As shown in FIG. 1, a delta sigma modulator 10 in accordance with a preferred embodiment of the invention includes an input CCD 12 and a summing (or sum) CCD 14. The output of input CCD 12 is coupled to the input of summing CCD 14. The output of summing CCD 14 is coupled to a readout 16 which drives a comparator that compares a sample of the charge in summing CCD 14 with a predetermined charge.

The output of readout 16 is coupled to an output comparator 20. An integrator/recirculator input CCD 18 returns the samples utilized by readout 16 to summing CCD 14. One output of comparator 20 is coupled to a fill and spill reference CCD 22. Depending on the comparator output signal, fill and spill reference CCD 22 either feeds back a charge to summing CCD 14 or takes charge away. The other output of comparator 20 is supplied to a low pass digital filter (not shown), and a decimator (not shown) is coupled to the output of the digital filter whose output signal is a high resolution digitized signal representative of the analog input signal sampled by input CCD 12.

In operation, input CCD 12 samples an analog input signal and injects into summing CCD 14 an amount of charge proportional to the input analog signal magnitude. The output signal of summing CCD 14 is read by readout 16 and compared to a reference level. If the readout signal from readout 16 is less than the reference level, a fixed amount of charge is injected into summing CCD 14 in the next clock period by fill and spill reference CCD 22. If the charge from summing CCD 14 is greater than the reference charge, the reference charge is subtracted, or drained, from summing CCD 14 in the next clock period by fill and spill reference CCD 22.

The output signal from readout 16 is applied to comparator 20. If this signal is greater than a predetermined reference level, a digital "one" is generated, and the fill and spill reference CCD is conditioned to extract a fixed reference charge from the summing CCD. If the output signal from readout 16 is less than the predetermined reference level, a digital "zero" is generated and the fill and spill reference CCD is conditioned to add a fixed reference charge to the summing CCD. In either case, the sample of the charge from the summing CCD that was utilized by readout 16 is then returned to the summing CCD by an integrator/recirculator CCD 18.

If a digital zero is produced by comparator 20, a charge is added to summing CCD 14 by fill and spill reference CCD 22. If a digital one is produced by comparator 20, a charge is subtracted from summing CCD 14 by fill and spill reference CCD 22.

Although the modulator shown in FIG. 1 is a first order modulator, those skilled in the art will recognize that higher order loops can be realized by including within a single feedback loop multiple integrators of the type shown. As is also known, even higher order modulators can be realized by cascading individual feedback loops.

FIG. 2 pictorially illustrates electrodes arranged on the surface of fill and spill reference CCD 22. CCD 22, as previously explained, operates to add or subtract a reference charge to or from summing CCD 14 (FIG. 1). Voltage Vp controls the input/output mode of CCD 22 through a heavily-doped n+ region in the p type silicon body of the device. Voltage V1 controls the dumping of a charge to or from the diode of CCD 22. The difference between voltages V2 and V3 determines the magnitude of the reference charge. Voltage V4 controls the charge to and from summing CCD 14. Voltage Vs controls summing CCD 14.

More specifically, and with respect to adding a reference charge, by driving voltage Vp negative, more charge carriers 50 are forced to the surface as indicated in FIG. 2A. Then, by heavily reverse biasing voltage Vp, charge packet 52 is formed as shown in FIG. 2B. The charge packets in CCD 22 and CCD 14 are then added by controlling voltages V1, V2, V3 and Vp in a manner known in the art, so as to transfer charge to region 54, shown in FIG. 2C, and then combining them in a charge well 56, as shown in FIG. 2D.

With respect to subtracting a reference charge, the negative charge packet 59 is formed as illustrated in FIG. 2F, and charge is then subtracted, leaving charge 60 as a remainder in a potential well, as shown in FIG. 2F. The negative charge packet 62 is then dumped, as shown in FIG. 2G. The above described operations represented in FIGS. 2E–2G are performed by controlling voltages V1, V2, V3, V4 and Vs appropriately, as known in the art.

In accordance with another embodiment, and for feedback loop functions which require scaling coefficients greater than unity, a charge replicator scheme may be utilized. In a charge replicator scheme, the charge to be replicated is read out by reading a voltage change on an electrode that does not actually make contact to the charge; that is, a voltage change is induced in the body of the device by capacitive coupling using, for example, a floating-gate non-destructive readout. The voltage change is then utilized in a fill-and-spill structure to generate a new charge packet that is proportional in magnitude to the original charge.

By using modulator 10, the impact of transfer inefficiency and readout non-linearities is attenuated. It is possible to minimize the readout non-linearity effects and readout power by using a floating gate technique. Readout, by this technique, is performed by sensing the potential change on a gate floating above the CCD channel, while the signal charge never leaves the CCD structure.

The power consumption of modulator 10 is generally a result of the charge current through the channel resistance, the power required by comparators 16 and 20 (FIG. 1), and the power needed to charge the CCD gates. The channel power dissipation is very small. In one embodiment, channel power dissipation is on the order of nanowatts (nW). To further reduce power requirements, a clocked comparator can be used, for example, to consume power only when performing a comparison. The main sink of power is in moving the gate drive charge. Techniques for moving such gate drive charges, such as resonant clocking, can help minimize gate drive power.

Figure 3:
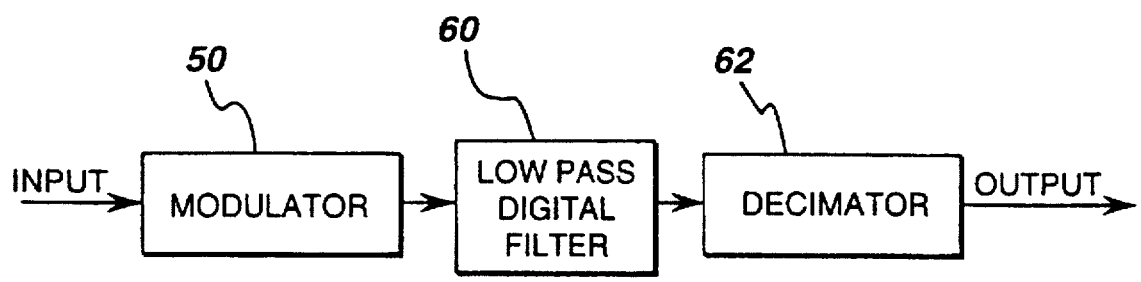
FIG. 3 is a block diagram of the delta sigma modulator shown in FIG. 1 employed in an analog-to-digital converter.

FIG. 3 shows delta sigma modulator 10 employed in an analog-to-digital converter configuration. The output signal of modulator 10 is low-pass filtered by a low pass digital filter 60, and the output signal of low pass filter 60 is decimated by a decimator 62, which produces the analog-to-digital converter output signal.

The delta sigma modulator described above exhibits reduced quiescent power consumption as compared to known delta sigma modulators, since it employs no op amps. In addition, this reduction in quiescent power consumption is achieved without loss in resolution.

While only certain preferred features of the invention have been illustrated and described, many modifications and changes will occur to those skilled in the art. For example, while a first order delta sigma modulator has been described in detail herein, the charge coupled device architecture could be expanded to delta sigma modulators having higher orders, such as second and third order delta sigma modulators. It is, therefore, to be understood that the appended claims are intended to cover all such modifications and changes as fall within the true spirit of the invention.

What is claimed is:

1. A delta sigma modulator comprising:
   an input charge coupled device for sampling an input analog signal and generating a first charge proportional to the magnitude of the input analog signal;

a summing charge coupled device for receiving charge and for generating a summed charge;

readout means for generating a readout signal responsive to said summed charge;

an output comparator for comparing said readout signal with a predetermined reference level and for generating a predetermined output signal in accordance with the level of said readout signal relative to said reference level; and a fill and spill reference charge coupled device responsive to said output signal for adding or subtracting a reference charge to said input charge coupled device.

2. The delta sigma modulator of claim 1 including an integration and recirculation charge coupled device adapted to inject a reference charge into said summing charge coupled device whenever the readout signal from said readout means is less than said predetermined reference level.

3. The delta sigma modulator of claim 1 wherein said fill and spill reference charge coupled device is adapted to subtract said reference charge from said summing charge coupled device whenever the readout signal from said readout means is greater than said predetermined reference level.

4. The delta sigma modulator of claim 1 including an integration and recirculation charge coupled device adapted to inject a fixed amount of charge into said summing charge coupled device whenever the readout signal from said readout means is negative.

5. The delta sigma modulator of claim 4 wherein said output comparator is adapted to produce a digital "one" whenever said readout signal is greater than said predetermined reference level.

6. The delta sigma modulator of claim 4 wherein said output comparator is adapted to produce a digital "zero" whenever said readout signal is less than said predetermined reference level.

7. The delta sigma modulator of claim 6 wherein said fill and spill reference charge coupled device is adapted to add a charge to said summing charge coupled device whenever said output comparator produces a digital zero.

8. The delta sigma modulator of claim 7 wherein said fill and spill reference charge coupled device is adapted to subtract a charge from said summing charge coupled device whenever a digital one is produced by said output comparator.

9. A delta-sigma modulator comprising:

an imput charge coupled device for sampling an input analog signal and generating a first charge proportional to the magnitude of the input analog signal;

an integrator responsive to said input charge coupled device for generating an integrated charge representative of the input analog signal, said integrator comprising a summing charge coupled device for receiving the first charge and for generating a summed charge;

readout means for generating a readout signal responsive to said summed charge; and an analog-to-digital converter for generating a digital signal representative of the integrated charge.

10. The delta signal modulator of claim 9 wherein said analog-to-digital converter comprises an output comparator for comparing the readout signal with a predetermined reference level and generating an output signal as a result of the comparison.

11. The delta sigma modulator of claim 10 wherein said integrator comprises an integration and recirculation charge coupled device adapted to inject a fixed amount of charge into said summing charge coupled device whenever said readout signal from said readout means is less than said predetermined reference level.

12. The delta sigma modulator of claim 11 wherein said integration and recirculation reference charge coupled device is adapted to inject a fixed amount of charge into said summing charge coupled device whenever said readout signal is negative.

13. The delta sigma modulator of claim 12 wherein said output comparator is adapted to produce a digital "one" whenever said readout signal is greater than said predetermined reference level.

14. The delta sigma modulator of claim 12 wherein said output comparator is adapted to produce a digital "zero" whenever said readout signal is less than said predetermined reference level.

* * * * *